(12) United States Patent
Kaneko et al.

(10) Patent No.: US 10,566,503 B2
(45) Date of Patent: Feb. 18, 2020

(54) MULTILAYER GLASS

(71) Applicant: HITACHI, LTD., Tokyo (JP)

(72) Inventors: Hiroki Kaneko, Tokyo (JP); Takashi Naito, Tokyo (JP); Yoshifumi Sekiguchi, Tokyo (JP); Tatsuya Miyake, Tokyo (JP)

(73) Assignee: HITACHI, LTD., Tokyo (JP)

(*) Notice: Subject to any disclaimer, the term of this patent is extended or adjusted under 35 U.S.C. 154(b) by 71 days.

(21) Appl. No.: 15/574,007

(22) PCT Filed: Mar. 14, 2016

(86) PCT No.: PCT/JP2016/057994
§ 371 (c)(1),
(2) Date: Nov. 14, 2017

(87) PCT Pub. No.: WO2016/185776
PCT Pub. Date: Nov. 24, 2016

(65) Prior Publication Data
US 2018/0294386 A1    Oct. 11, 2018

(30) Foreign Application Priority Data

May 18, 2015 (JP) .................................. 2015-100929

(51) Int. Cl.
*H01L 33/48* (2010.01)
*C03C 8/24* (2006.01)
(Continued)

(52) U.S. Cl.
CPC .............. *H01L 33/486* (2013.01); *C03C 8/24* (2013.01); *C03C 27/06* (2013.01);
(Continued)

(58) Field of Classification Search
CPC ... H01L 33/486; H01L 25/0753; H01L 33/60; H01L 33/62; C03C 8/24; C03C 27/06;
(Continued)

(56) References Cited

U.S. PATENT DOCUMENTS 5,665,654 A * 9/1997 Stansbury ............... H01J 9/185
438/23
8,192,051 B2 * 6/2012 Dau .......................... F21S 8/04
362/249.02
(Continued)

FOREIGN PATENT DOCUMENTS

JP    2002-053349 A    2/2002
JP    2006-524419 A    10/2006
(Continued)

OTHER PUBLICATIONS

International Search Report, PCT/JP2016/057994, Jun. 14, 2016, 2 pgs.

*Primary Examiner* — Albert H Cutler
(74) *Attorney, Agent, or Firm* — Volpe and Koenig, P.C.

(57) ABSTRACT

The purpose of the present invention is to decrease the process temperature for a multilayer glass into which an optical element is to be packed, thereby reducing the damage to the optical element during processing. A multilayer glass according to the present invention is so configured that a gap formed between glass plates is sealed with a sealing material that can fix at a process temperature lower than a temperature employed for the processing of an optical element (see FIG. 1).

14 Claims, 11 Drawing Sheets

(51) Int. Cl.

| | | |
|---|---|---|
| *H01L 25/075* | (2006.01) | |
| *H01L 33/60* | (2010.01) | |
| *H04N 5/225* | (2006.01) | |
| *C03C 27/06* | (2006.01) | |
| *G06T 7/55* | (2017.01) | |
| *G06T 7/70* | (2017.01) | |
| *B60J 1/00* | (2006.01) | |
| *B60J 1/02* | (2006.01) | |
| *B60J 1/18* | (2006.01) | |
| *B60Q 1/04* | (2006.01) | |
| *B60Q 1/22* | (2006.01) | |
| *F25D 27/00* | (2006.01) | |
| *H01L 33/62* | (2010.01) | |
| *H04N 5/247* | (2006.01) | |

(52) U.S. Cl.
CPC .......... *H01L 25/0753* (2013.01); *H01L 33/60* (2013.01); *H04N 5/2256* (2013.01); *B60J 1/001* (2013.01); *B60J 1/02* (2013.01); *B60J 1/18* (2013.01); *B60Q 1/04* (2013.01); *B60Q 1/22* (2013.01); *F25D 27/00* (2013.01); *G06T 7/55* (2017.01); *G06T 7/70* (2017.01); *G06T 2207/30196* (2013.01); *G06T 2207/30252* (2013.01); *H01L 33/62* (2013.01); *H04N 5/247* (2013.01)

(58) Field of Classification Search
CPC .. F25D 27/00; B60Q 1/22; B60Q 1/04; G06T 2207/30252; G06T 7/70; G06T 7/55; G06T 2207/30196; B60J 1/02; B60J 1/001; B60J 1/18; H04N 5/247; H04N 5/2256

See application file for complete search history.

(56) References Cited

U.S. PATENT DOCUMENTS

| | | | | |
|---|---|---|---|---|
| 9,214,614 | B2* | 12/2015 | Jones | ............. H01L 33/62 |
| 9,299,899 | B2* | 3/2016 | Corwin | ............. H01L 25/0753 |
| 9,837,587 | B2* | 12/2017 | Maki | ............. H01L 33/62 |
| 10,032,753 | B2* | 7/2018 | Jones | ............. H01L 25/0753 |
| 2007/0007894 | A1 | 1/2007 | Aitken et al. | |
| 2008/0211384 | A1* | 9/2008 | Sawai | ............. C03C 3/21 |
| | | | | 313/495 |
| 2009/0114928 | A1* | 5/2009 | Messere | ............. B32B 17/10 |
| | | | | 257/88 |
| 2009/0155555 | A1 | 6/2009 | Botelho et al. | |
| 2010/0129666 | A1 | 5/2010 | Logunov et al. | |
| 2012/0147538 | A1 | 6/2012 | Kawanami et al. | |
| 2014/0061623 | A1* | 3/2014 | Drake | ............. C03C 3/21 |
| | | | | 257/40 |
| 2015/0270508 | A1 | 9/2015 | Naito et al. | |
| 2016/0096768 | A1* | 4/2016 | Takao | ............. C03B 23/245 |
| | | | | 428/34 |

FOREIGN PATENT DOCUMENTS

| | | |
|---|---|---|
| JP | 2009-512977 A | 3/2009 |
| JP | 2011-502947 A | 1/2011 |
| JP | 2012-509830 A | 4/2012 |
| WO | 2011/001987 A1 | 1/2011 |
| WO | 2014/061515 A1 | 4/2014 |

* cited by examiner

MULTILAYER GLASS

TECHNICAL FIELD

The present invention relates to multilayer glass.

BACKGROUND ART

Light-emitting parts equipped with light-emitting diodes (LEDs) are provided by installing LEDs in a gap formed between two glass sheets, and by sealing the gap with a sealing material. Patent Literature 1 mentioned below describes a light emission structure in which electrodes are formed on the surfaces of two glass sheets and the electrodes are connected to LEDs.

CITATION LIST

Patent Literature

Patent Literature 1: Japanese Unexamined Patent Application Publication (Translation of PCT Application) No. 2009-512977

SUMMARY OF INVENTION

Technical Problem

In Patent Literature 1 mentioned above, LEDs are sealed within a gap with a lead glass frit. Sealing the gap with a glass frit involves melting the glass frit and joining the glass sheets together. A processing temperature for the lead glass frit is generally high, and therefore, there is a possibility that the LEDs are damaged by processing heat during a sealing process.

The present invention has been made in view of a problem noted above and is intended to decrease the processing temperature for a multilayer glass in which optical elements are packed and reduce the possibility of damaging the optical elements during processing.

Solution to Problem

A multilayer glass pertaining to the present invention is such that a gap formed between glass plates is sealed with a sealing material that can be fixed at a process temperature that is lower than the processing temperature for optical elements.

Advantageous Effects of Invention

According to a multilayer glass pertaining to the present invention, it is possible to decrease the process temperature for a multilayer glass including optical elements.

Problems, configurations, and advantageous effects which are other than noted above will become apparent from the following description of embodiments.

DESCRIPTION OF EMBODIMENTS

First Embodiment: Outlined Structure

Figure 1:
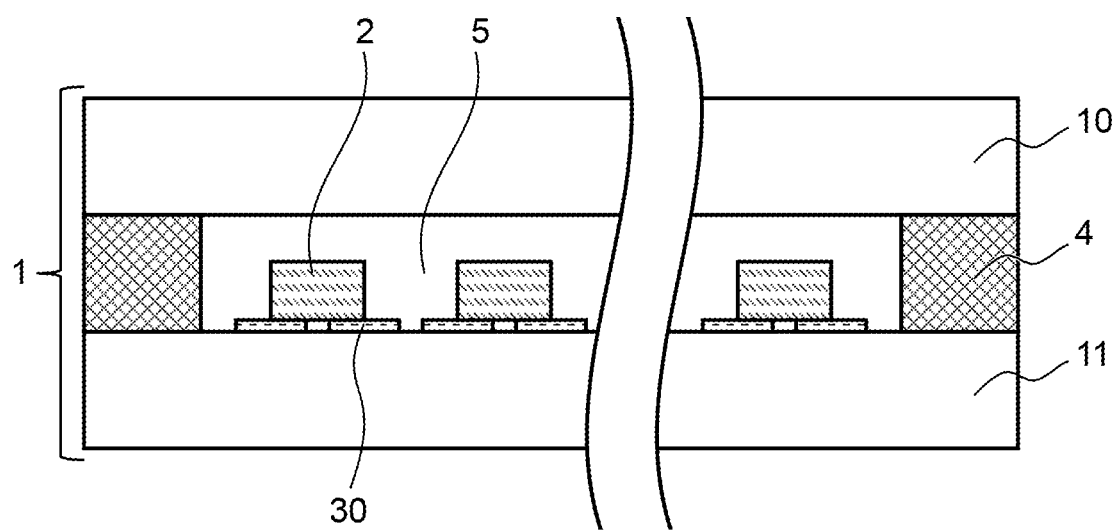
FIG. 1 is a side cross-sectional view of a multilayer glass 1 pertaining to a first embodiment of the present invention, depicting the multilayer glass structure.

FIG. 1 is a side cross-sectional view of a multilayer glass 1 pertaining to a first embodiment of the present invention, depicting the multilayer glass structure. Two glass plates 10 and 11 are placed to face each other across a gap 5. In space in the gap 5, conductors 30 are formed on the surface of a glass plate 11 and optical elements (e.g., light-emitting diodes (LEDs)) 2 are installed. The conductors 30 and the LEDs 2 are electrically connected with each other.

The glass plates 10 and 11 are of planar glass and, for example, those having high transmittance for visible light can be used as them. The surface of the inner side (abutting the gap 5) of each glass plate is preferably flat from a perspective of convenience for placing conductors 30 thereon, but the inner side may, for example, have a gently curved surface. The glass plates 10 and 11 are not necessarily required to be equal in size. Although the type of the glass plates 10 and 11 is not defined specifically, soda-lime glass, white sheet glass, air-cooled hardened glass, etc. may expediently be used.

Figure 2:
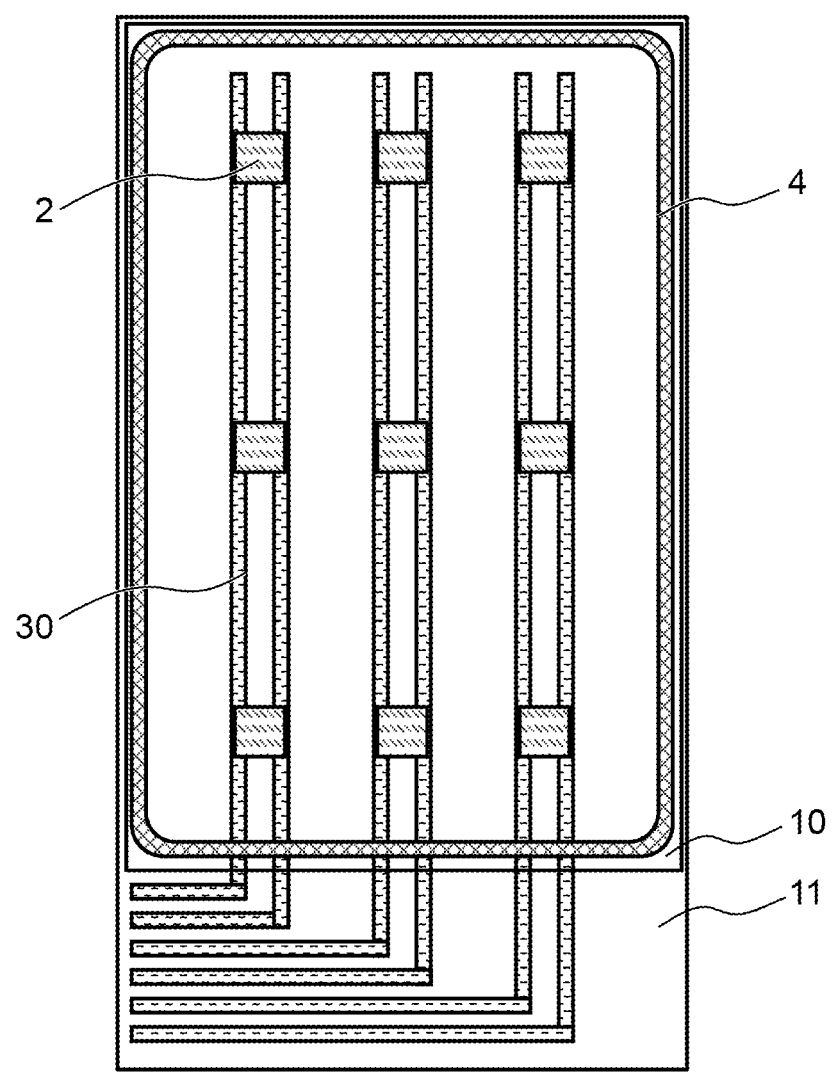
FIG. 2 is a top view of the multilayer glass 1.

FIG. 2 is a top view of the multilayer glass 1 (viewed from above the glass plate 10). The surface area of the glass plate 11 is larger than the surface area of the glass plate 10. In a region where both glass plates overlap entirely, portions along the inner perimeter of the glass plate 10 are sealed with a low-temperature sealing material 4 that works at a low process temperature. The gap 5 is sealed in a vacuum or near vacuum state by the low-temperature sealing material 4.

The conductors 30 are each formed in two wires connected to an anode and a cathode of an LED 2. Separate conductors 30 may be provided for each LED 2 or a plurality of LEDs 2 may be connected in series with a single conductor 30, as depicted in FIG. 2. If the LEDs 2 are arranged at lattice points, a plurality of pairs of conductors 30 may also be provided.

On a part of the surface of the glass plate 11 that does not overlap with the glass plate 10, the conductors 30 are formed so as to be pulled out. By connecting these pulled out conductors with an external circuit (not depicted), power can be supplied to the LEDs 2. By making this part having the pulled out conductors non-overlapping with the glass plate 10, connection with an external circuit and assembly are facilitated. In the case of sandwiching the conductors 30 between the glass plates, as depicted in FIG. 2, seal thickness in portions where the conductors 30 are sandwiched may be increased to enhance gas barrier performance.

The LEDs 2 are turned on by applying a voltage to the LEDs 2 from an external circuit (not depicted) via the conductors 30. Light of the LEDs 2 mainly irradiates the outside periphery of the multilayer glass through the glass plates 10 and 11.

Figure 3:
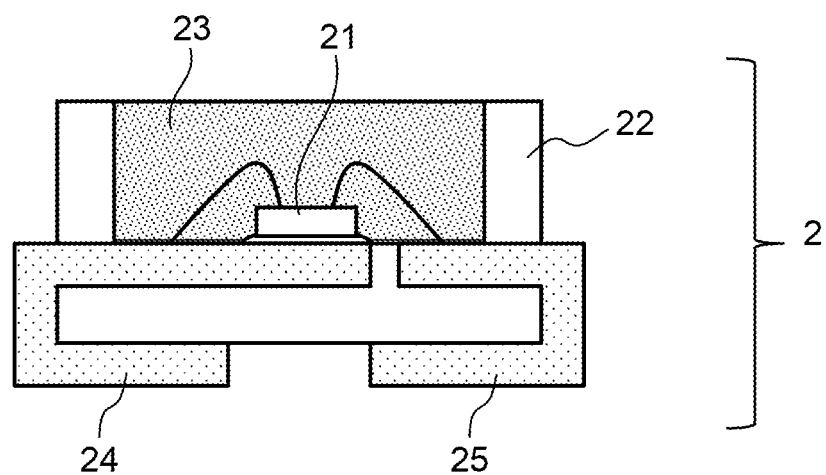
FIG. 3 is a side cross-sectional view of an LED 2, depicting its structure.

FIG. 3 is a side cross-sectional view of an LED 2, depicting its structure. An LED element 21 is electrically connected to lead frames 24 and 25 of a package 22 and sealed by sealing resin 23; the LED 2 as a whole is thus packaged. In the case of a packaged LED 2, an LED provided with a lens function can be used. In this case, it is possible to control an emission direction and spreading of light of an LED 2. A wavelength of light emitted by an LED 2 (visible light, an ultraviolet region, an infrared region, etc.) can be selected according to application and LEDs 2 of different wavelengths may be used concurrently. A phosphor which emits light, excited by light of the LED element 21, may be mixed for use in the sealing resin 23. This allows for spreading a region of wavelengths of light emission. For example, combining a blue light LED 2 with a yellow light phosphor can create white light. In the case of a packaged LED 2, since its light emission direction can be controlled, it is, for example, effective in a case where it is desired to emit light in a direction of one side of the multilayer glass 1.

First Embodiment: Detail of Respective Parts

As the conductors 30, metal wires having a low electrical resistance can be used. The conductors 30 are formed in advance on the glass plate. As the conductors 30, it is preferable to use a transparent electrode of indium tin oxide (ITO: tin-doped indium oxide), indium zinc oxide (IZO), and a carbon nanotube among others, because the conductors 30 become less apparent. Even metal wires can be made nearly transparent by thinning its film thickness. Also, a Flexible Printed Circuit (FPC) with the conductors 30 mounted thereon may be sandwiched for use between the glass plates. In this case, it is also possible to mount optical elements on the FPC beforehand.

As the low-temperature sealing material 4, it is preferable to use a sealing material whose melting point is as low as possible and its softening point is preferably not more than 350° C., and more preferably, not more than 300° C. The softening point termed here refers to a second endothermic peak temperature by differential thermal analysis (DTA). For example, vanadic glass (glass containing vanadium as a constituent element) such as $AG_2O$—$V_2O_5$—$TeO_2$ has a softening point ranging from, approximately, 220° C. to 280° C. and it is preferable as the low-temperature sealing material 4, because it can seal the gap 5 at the above-mentioned temperature. It is also preferable as the sealing material for hardened glass in which compression stress is relieved and its hardening performance decreases when its temperature is increased up to 400° C. or above. In addition, particularly to suppress crystallization of glass, it is possible to add a substance mentioned below in a very low dose to vanadic glass: $BaO$, $WO_3$, $Y_2O_3$, $La_2O_3$, $Al_2O_3$, $Fe_2O_3$, etc. To reduce the generation of stress at seal portions, a low thermal expansion filler (ZWP filter) may be dosed to match thermal expansion of the glass plates and thermal expansion of the seal portions. Alternatively, a metal filler (such as Sn or Al) may be dosed to relieve stress.

In a process of sealing the gap 5 with the low-temperature sealing material 4, a way that heats the entire multilayer glass 1 at a temperature from 220° C. to 280° C. or a way that locally heats only in the vicinity of the seal portions may be used. In the latter case, the glass may be prevented from being broken by preheating the entire glass to decrease the temperature difference between locally heated portions and other portions. Since the melting point of the low-temperature sealing material 4 is low, even in a case where the sealing process is performed after optical elements 2 are installed within the gap 5, damage to these members can be reduced. Moreover, even in a case where the conductors 30 are disposed in the vicinity of the seal portions as depicted in FIG. 2, damage to the conductors 30 can be reduced.

Vanadic glass has low gas permeability, while having a property of adsorbing gas. Hence, when the gap 5 is put in a vacuum state (or near vacuum state), it is possible to adsorb internal gas, while preventing entering of air from outside, and therefore, the degree of vacuum after sealing can be increased or maintained.

The gap 5 is a space that is sandwiched between the glass plates 10 and 11 and formed inside the multilayer glass. The distance between the glass plates 10 and 11 (height of the gap 5) ranges, for example, approximately, from 0.2 mm to 10 mm. By providing the gap 5, the heat insulation property of the multilayer glass 1 can be improved. It is preferable that the gap 5 is internally vacuum, e.g., at approximately $10^-3$ Pa, from a perspective of adiabaticity. As necessary, inter alia, argon gas, air, or a desiccant may be packed in the gap 5. In either a case where the gap 5 is made internally vacuum or a case where gas is packed, the gap 5 has a refraction index of 1, whereas optical members such as lenses which are mounted on the optical elements 2 (e.g., LEDs or cameras) are made of glass or resin having a refraction index of 1.4 to 1.6. Hence, the difference between these refraction indexes enables the optical members to function as lenses.

First Embodiment: Conclusion

Since the multilayer glass 1 pertaining to this first embodiment uses the low-temperature sealing material 4 (e.g., vanadic glass) in the seal portions, it is possible to decrease processing temperature when joining the glass plates 10 and 11 together and reduce thermal damage to the LEDs 2 and the conductors 30. In addition, since vanadic glass adsorbs gas, in a case where the gap 5 is made internally vacuum, it is possible to adsorb gas, even if emitted by the LEDs 2 or the like, and maintain the degree of vacuum. By maintaining the degree of vacuum within the gap 5, it is possible to maintain the heat insulation property of the multilayer glass 1.

In this first embodiment, since the low-temperature sealing material 4 serves as isolation between the gap 5 and outside, it is possible to prevent that the optical elements 2 are exposed to halogen gas or sulfidizing gas and corrodes or deteriorates. In addition, the low-temperature sealing material 4 provides an advantageous effect of preventing some of light emitted by the LEDs from leaking out of the gap 5 unnecessarily.

A processing temperature (a softening point for a glass sealing material) when fixing the low-temperature sealing material 4 has an effect on a temperature that is applied to the optical elements mounted on the glass plate and is, preferably, lower than a processing temperature when manufacturing the optical elements 2 or a temperature when mounting the optical elements on the glass. This is because, if the gap 5 is sealed at a higher temperature than the processing temperature for the optical elements 2, the processing heat for the sealing increases the probability of thermal damage to the optical elements 2. The processing temperature for the optical elements 2, termed here, is, for example, a temperature when depositing semiconductor layers. If heat that is higher than this temperature is applied, there is a possibility that the optical elements are subjected to unintended processing; therefore, a sealing temperature was set to be lower than this temperature. If a temperature when processing the optical elements 2 differs for different processes, the lowest temperature should be selected as a reference and it is preferable to set the sealing temperature lower than the lowest temperature. In addition, in a case where the optical elements 2 include a member made of resin or the like, it is preferable that a temperature of the optical elements 2, when fixing the low-temperature sealing material 4, is set to be lower than either the processing temperature for the resin or the temperature when mounting the optical elements 2, whichever is higher.

Second Embodiment

Figure 4:
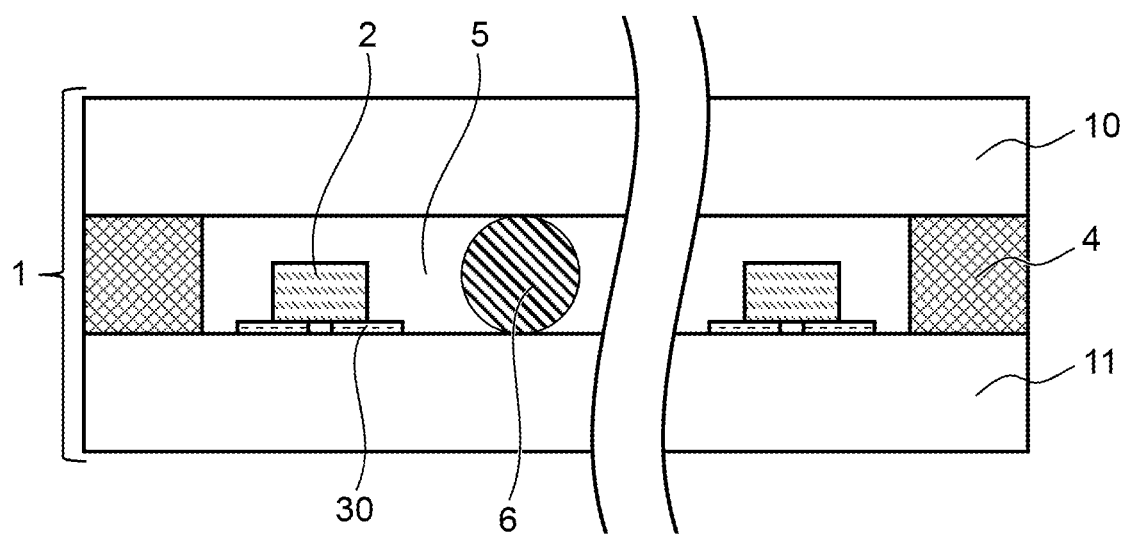
FIG. 4 is a side cross-sectional view of a multilayer glass 1 pertaining to a second embodiment of the present invention, depicting the multilayer glass structure.

FIG. 4 is a side cross-sectional view of a multilayer glass 1 pertaining to a second embodiment of the present invention, depicting the multilayer glass structure. A spacer 6 is placed between the glass plates 10 and 11. The space 6 is a member which secures a separation distance between the glass plates 10 and 11. Any given number of spacers 6 can be packed in the gap 5. In FIG. 4, the same members as those in the first embodiment are assigned the same reference numerals and their repetitive description is omitted. This is also true for embodiments which will be described later.

The spacer 6 can be made of a material such as, e.g., glass, ceramics, and resin. The shape of the spacer 6 can be selected appropriately. For instance, if a spherical glass bead is used as the spacer 6, a suitable number of spacers 6 are distributed within the gap 5 before sealing the gap 5, and then the gap 5 is sealed. Alternatively, columnar spacers 6 may be arranged on the glass plate and fixed by applying heat.

If it is desired to avoid that the glass plate 10 and the LEDs 2 contact with each other, the height of each spacer 6 should be made higher than the height of the LEDs 2 and each spacer 6 should be placed relatively near each LED 2. If it is sufficient to avoid that glass plates 10 and 11 contact with each other, the height of each spacer 6 may not necessarily be higher than the height of the LEDs.

Placing spacers 6 within the gap 5 can prevent the glass plates 10 and 11 from bending and contacting with each other, especially when the gap 5 has internally been put in a vacuum state. In other words, it is possible to prevent degradation in the heat insulation property of the multilayer glass 1.

Third Embodiment

Figure 5:
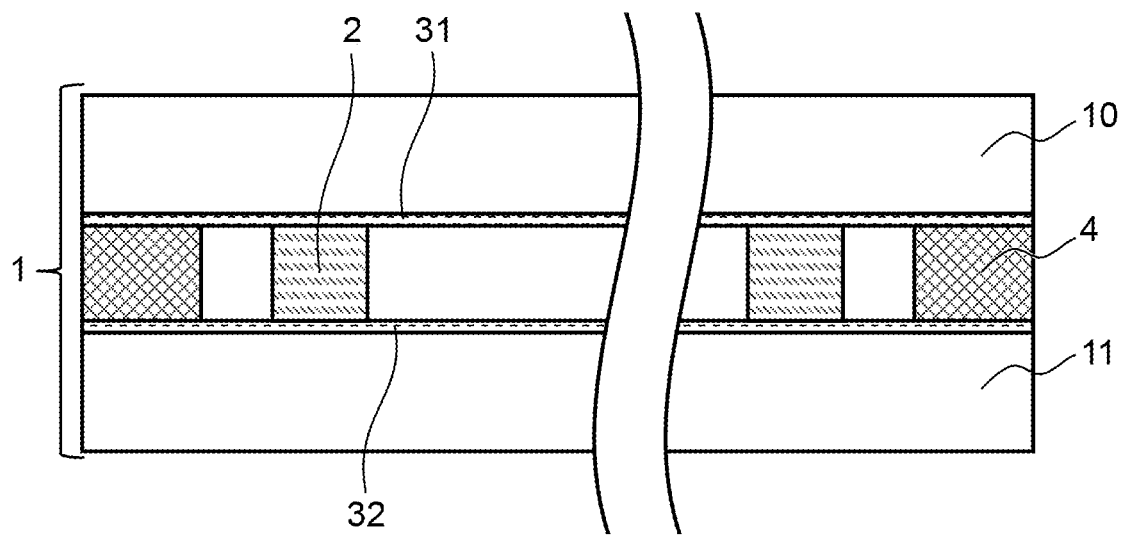
FIG. 5 is a side cross-sectional view of a multilayer glass 1 pertaining to a third embodiment of the present invention, depicting the multilayer glass structure.

FIG. 5 is a side cross-sectional view of a multilayer glass 1 pertaining to a third embodiment of the present invention, depicting the multilayer glass structure. While a pair of conductors 30 is formed on the surface of the glass plate 11 in the first embodiment (e.g., see FIG. 2), a single conductor 31 is formed on the surface of the glass plate 10 and a single conductor 32 is formed on the surface of the glass plate 11 in FIG. 5. If a plurality of LEDs 2 are present, a plurality of pairs of conductors 31 and 32 can be provided correspondingly. The conductor 31 is electrically connected to one end of an LED 2 and the conductor 32 is electrically connected to the other end of the LED 2.

According to the structure depicted in FIG. 5, the LED 2 fulfills the same role as the spacer 6 and can prevent the glass plates 10 and 11 from bending and contacting with each other when the gap 5 has been made vacuum. If the number of LEDs 2 is small relative to the area of the glass plates 10 and 11, there is a possibility that plate portions not contacting with the LEDs bend and therefore spacers 6 may be used additionally.

Figure 6A:
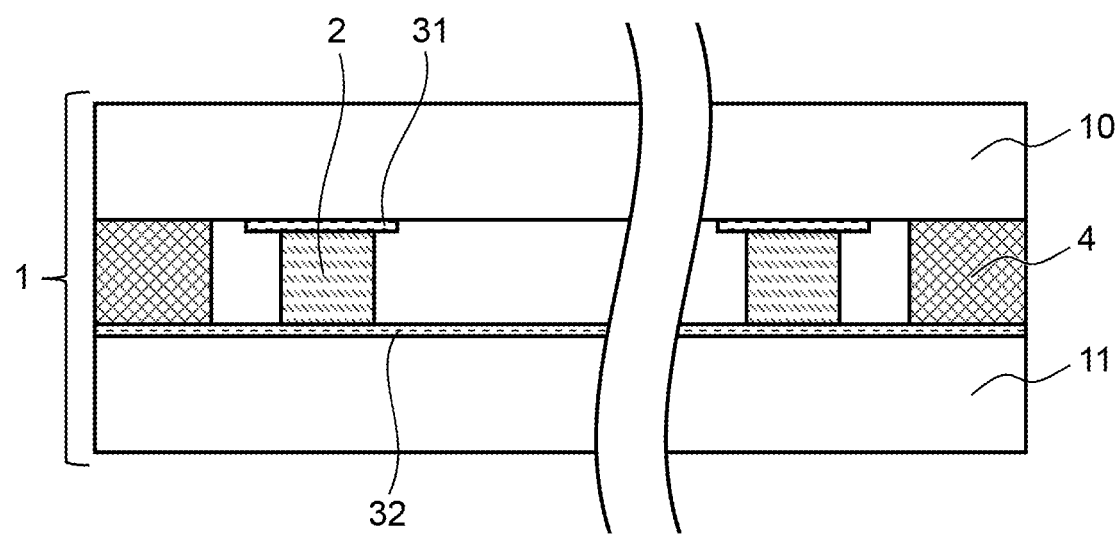
FIG. 6A is a side cross-sectional view depicting a structure example in which conductors 31 and 32 are placed to extend in directions that are orthogonal to each other.

FIG. 6A is a side cross-sectional view depicting a structure example in which the conductors 31 and 32 are placed to extend in directions that are orthogonal to each other. While the conductors 31 and 32 extend in the same direction in FIG. 5, they can be made to extend in directions that are orthogonal to each other.

Figure 6B:
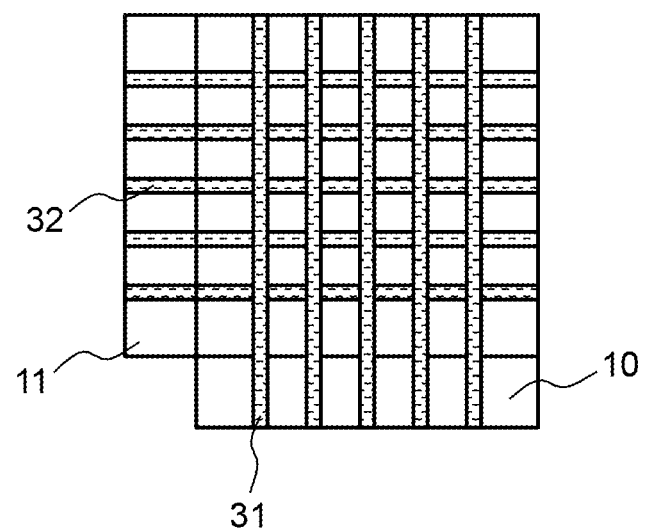
FIG. 6B is a top view of FIG. 6A.

FIG. 6B is a top view of FIG. 6A. A plurality of LEDs are arranged at lattice points. Conductors 31 extend in a vertical direction of FIG. 6B and conductors 32 extend in a horizontal direction of FIG. 6B, and they are placed crossing in a lattice form. By arranging the conductors 31 and 32 in a lattice form as in FIG. 6B, it is possible to selectively cause LEDs 2 arranged in positions where the conductors 31 and 32 cross to emit light. This enables formation of a particular light emission pattern corresponding to, for example, a character or the like.

In the third embodiment, since both the top and bottom edges of each LED 2 contact with a conductor, heat that is generated when the LEDs 2 emit light can be dissipated through both the glass plates 10 and 11. This provides an advantageous effect of decreasing the temperature of the LEDs 2 and increasing light emission efficiency. In addition, if the multilayer glass 1 is used outdoors, as heat is conducted to the glass plates, it is possible to lessen snow and ice accretion on the surfaces of the glass plates. To further reduce snow and ice accretion, a nichrome wire or the like may be placed inside the glass plates to heat them appropriately.

Fourth Embodiment

Figure 7:
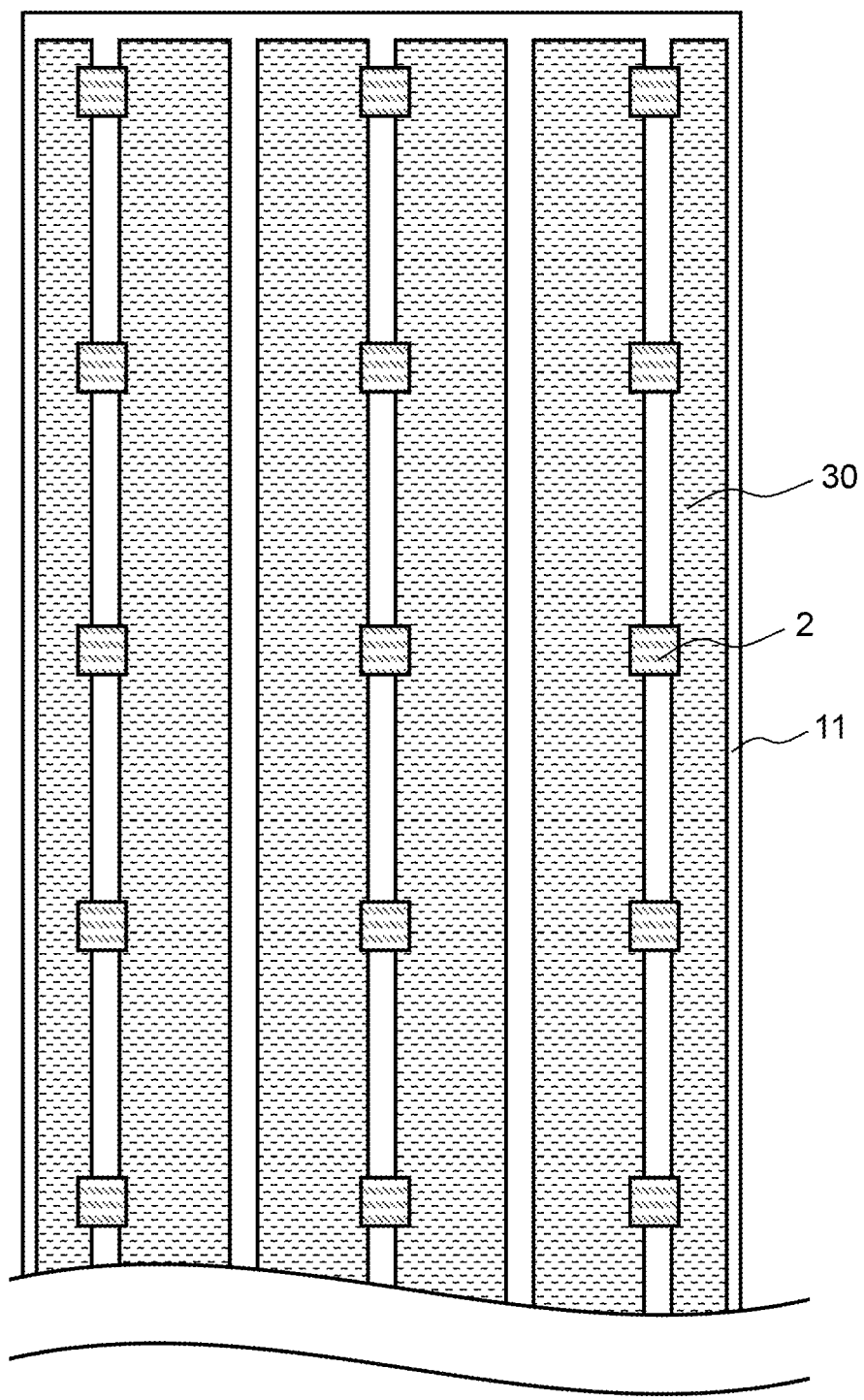
FIG. 7 is a top view of a multilayer glass 1 pertaining to a fourth embodiment of the present invention.

FIG. 7 is a top view of a multilayer glass 1 pertaining to a fourth embodiment of the present invention. In this fourth embodiment, the conductors 30 are formed only on the surface of the glass palate 11, as is the case for the first embodiment. However, the conductors 30 are formed so as to be wider than those in the first embodiment and cover most of the surface of the glass plate 11.

As the low-temperature sealing material 4, it is preferable to use a sealing material whose melting point is as low as possible and its softening point is preferably not more than 350° C., and more preferably, not more than 300° C. The softening point termed here refers to a second endothermic peak temperature by differential thermal analysis (DTA). For example, vanadic glass (glass containing vanadium as a constituent element) such as $AG_2O$—$V_2O_5$—$TeO_2$ has a softening point ranging from, approximately, 220° C. to 280° C. and it is preferable as the low-temperature sealing material 4, because it can seal the gap 5 at the above-mentioned temperature. It is also preferable as the sealing material for hardened glass in which compression stress is relieved and its hardening performance decreases when its temperature is increased up to 400° C. or above. In addition, particularly to suppress crystallization of glass, it is possible to add a substance mentioned below in a very low dose to vanadic glass: $BaO$, $WO_3$, $Y_2O_3$, $La_2O_3$, $Al_2O_3$, $Fe_2O_3$, etc. To reduce the generation of stress at seal portions, a low thermal expansion filler (such as a ZWP filler) may be dosed to match thermal expansion of the glass plates and thermal expansion of the seal portions. Alternatively, a metal filler (such as Sn or Al) may be dosed to relieve stress.

Members to transmit light or reflect light can be provided separately from the conductors 30. For instance, the conductors 30 are configured as is the case for the first through third embodiments and members to reflect light with a particular wavelength may be placed in portions where the conductors 30 are not formed. Alternatively, a subset of the conductors 30 may be used only to reflect light, without being connected to the LEDs 2.

Fifth Embodiment

Figure 8A:
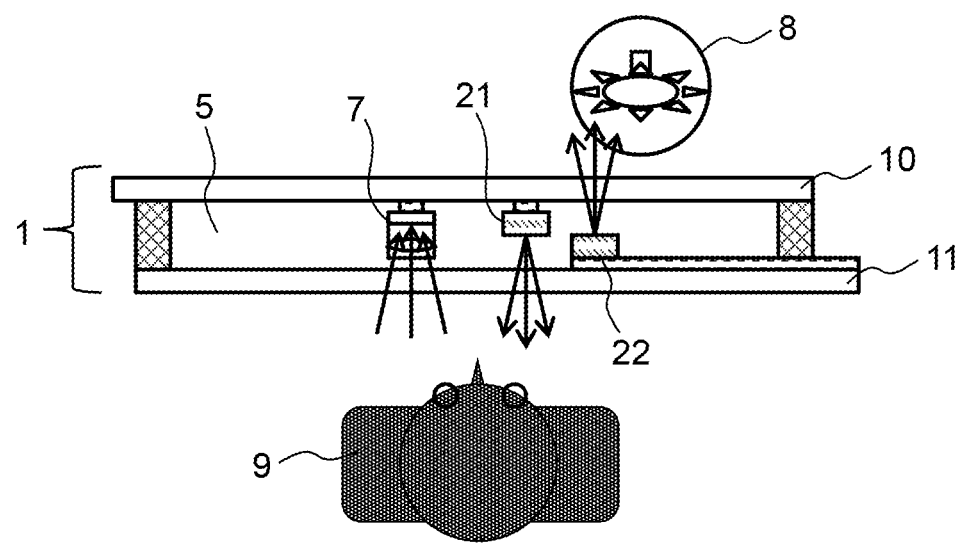
FIG. 8A is a top view of a multilayer glass 1 pertaining to a fifth embodiment of the present invention, depicting the multilayer glass structure.

FIG. 8A is a top view of a multilayer glass 1 pertaining to a fifth embodiment of the present invention, depicting the multilayer glass structure. In this fifth embodiment, LEDs 21, 22 and a camera 7 are installed in the gap 5 as optical elements. The LEDs 21, 22 and the camera 7 are connected to the conductors 30 respectively. A viewer 9 is present in front of the multilayer glass 1 and an object 8 is located in the rear of the multilayer glass 1 as viewed from the viewer 9 side.

Figure 8B:
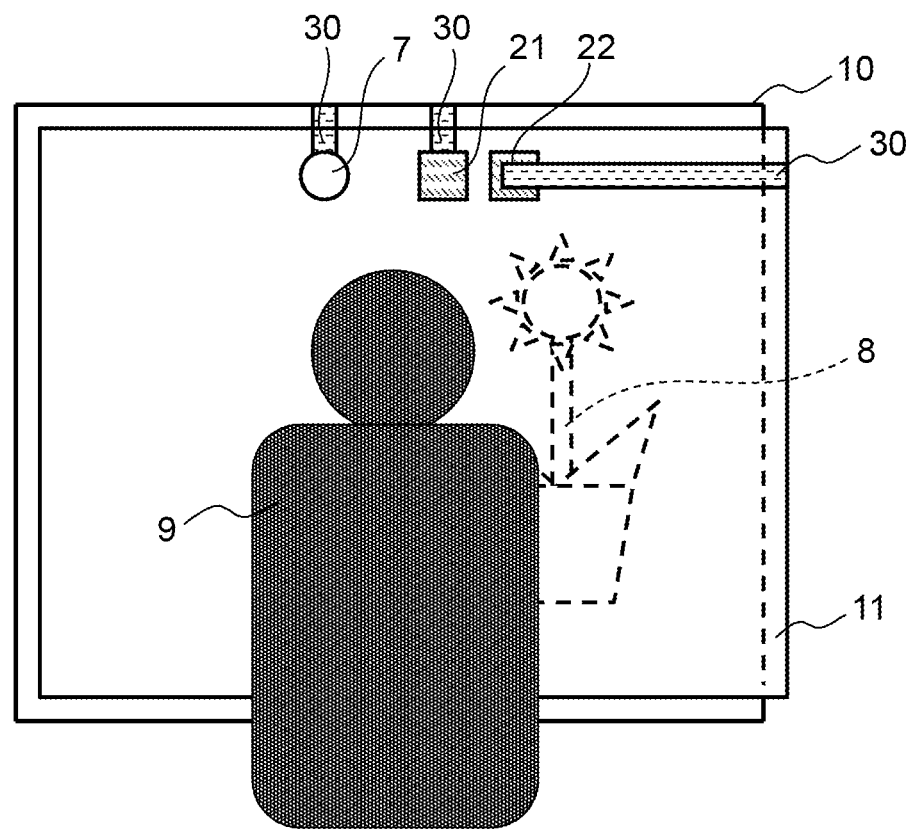
FIG. 8B is a front view of FIG. 8A.

FIG. 8B is a front view of FIG. 8A. In this fifth embodiment, an LED 21 mainly illuminates the viewer 9 side via a glass plate 11 and an LED 22 mainly illuminates the object 8 side via a glass plate 10. The camera 7 captures an image of the viewer 9 side via the glass plate 11.

Figure 9:
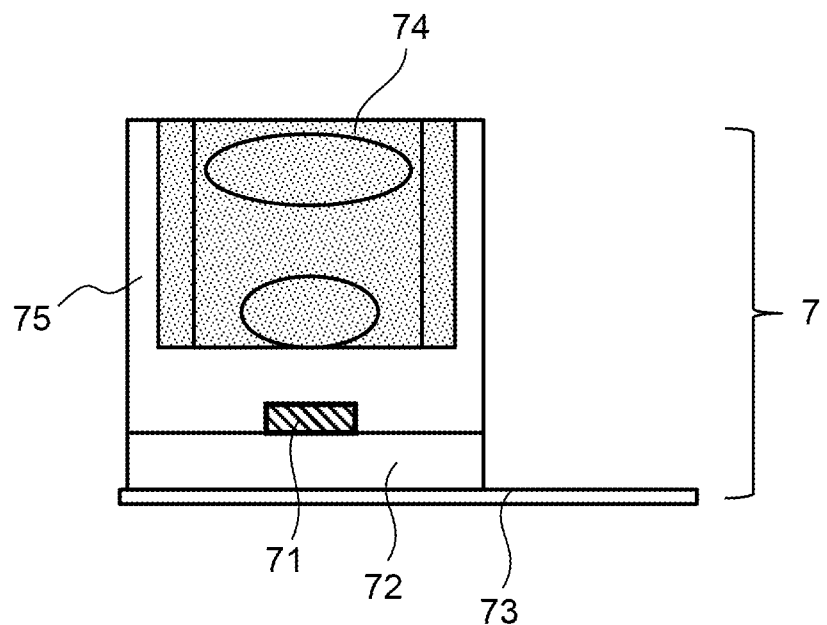
FIG. 9 is a side cross-sectional view of the camera 7, depicting its structure.

FIG. 9 is a side cross-sectional view of the camera 7, depicting its structure. A sensor unit 71 is mounted on a substrate 72 and the substrate 72 is electrically connected with an FPC 73. The FPC 73 may be integral with a conductor 30 or may be electrically connected to the conductor 30 separately. A lens unit 74 is placed above the sensor unit 71 and a mold 75 supports the sensor and the lens integrally. By shifting the position of the lens unit 74 up and down, a focus function for focusing can be implemented. The sensor unit 71 is, for example, an image pickup element such as a CMOS sensor or CCD sensor. A camera using a pinhole instead of the lens unit 74 can be used.

It is preferable to propagate an imaging signal to be transmitted and received by the camera 7 using a wire that has less signal degradation. For example, by fixing the FPC with a conductor 30 mounted thereon onto the surface of a glass plate and connecting it with the camera 7, it is possible to form the conductor 30 that is of a better quality than when the conductor 30 is directly formed on the surface of the glass plate.

The surface of the glass plate 11 may be provided with concave portions or convex portions and the camera 7 may capture an image across these portions; thereby, the glass plate 11 itself can be allowed to function as a lens. Likewise, the surface of the glass plate 10 or 11 may be provided with concave portions or convex portions and can be allowed to function as a lens to converge and spread light. Moreover, these concave portions or convex portions can be used as members for fitting and positioning the LEDs 21, 22, and camera 7.

In this fifth embodiment 5, one manner of utilization conceivable is that a computer becomes aware of a viewer 9 coming close to the multilayer glass 1 based on an image captured by the camera 7 and the LEDs 21 and 22 illuminate the object 8 according to instructions of the computer. In addition, it is also possible to display characters and graphics suitable for, inter alia, the age of the viewer 9 using the LEDs arranged in an array described with FIGS. 6A and 6B. Furthermore, a touch sensor may be placed on the viewer 9 side of the glass plate 11 to enable the viewer 9 to perform manipulation input. As one example of such a manner of utilization, using the multilayer glass 1 in a shopping window, usage as illustrated with FIGS. 8A and 8B is conceivable.

Sixth Embodiment

Figure 10:
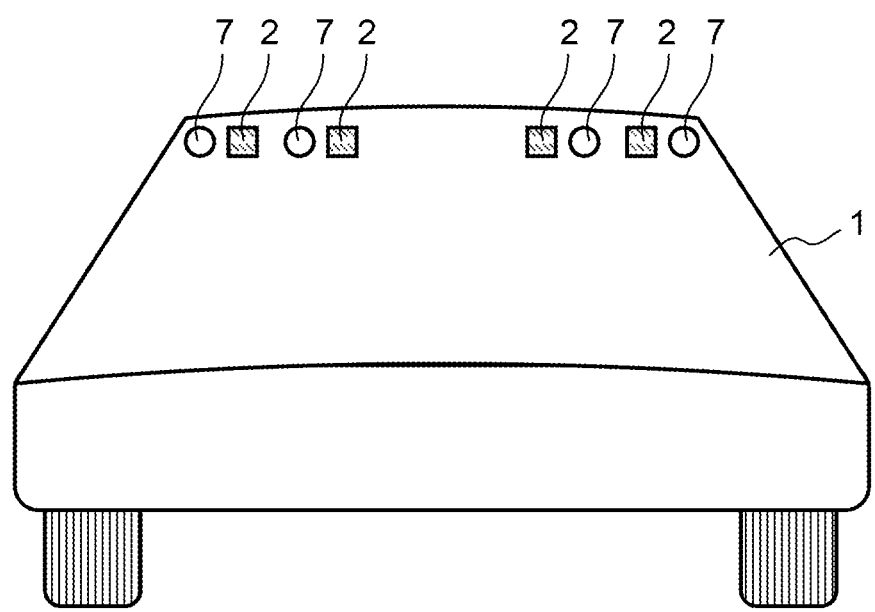
FIG. 10 is a front view of a multilayer glass 1 pertaining to a sixth embodiment of the present invention, depicting the multilayer glass structure.

FIG. 10 is a front view of a multilayer glass 1 pertaining to a sixth embodiment of the present invention, depicting the multilayer glass structure. Here, an example is illustrated in which the multilayer glass 1 is used as a windshield or a rear windshield of an automobile. The multilayer glass 1 is provided with a plurality of cameras 7 placed on both the right and left sides and parallax images forward or backward from the automobile can be captured by these cameras. This enables acquisition of information of distance from the automobile to an object whose image is to be captured. The multilayer glass 1 is further provided with LEDs 2 that serve for, for example, lighting forward or backward from the car at night and can aid image capturing by the cameras 7.

Figure 11:
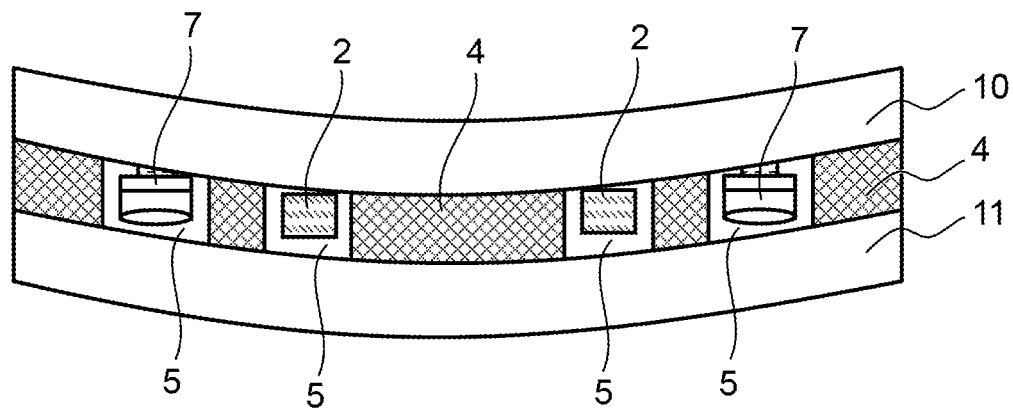
FIG. 11 is a top cross-sectional view of the multilayer glass 1 in the sixth embodiment.

FIG. 11 is a top cross-sectional view of the multilayer glass 1 in this sixth embodiment. The multilayer glass 1 is comprised of gently curved glass plates 10 and 11. In a case where the multilayer glass is configured as an in-vehicle part, it is a common practice to fill the gap 5 with any material except for the spaces for mounting optical elements. In FIG. 11, the gap 5 is filled with a low-temperature sealing material 4. In this case, since the low-temperature sealing material 4 needs to be transparent, it is conceivable that, for example, polyvinyl butyral (PVB) in a film form or epoxy resin is used as the low-temperature sealing material 4. Since resin cures by ultraviolet light irradiation or heating, a material for which a temperature for such irradiation or heating is lower than the processing temperature for the optical elements should be selected as the low-temperature sealing material 4. A curing temperature in this case is preferably not more than 350° C. and, more preferably, not more than 300° C.

Seventh Embodiment

Figure 12:
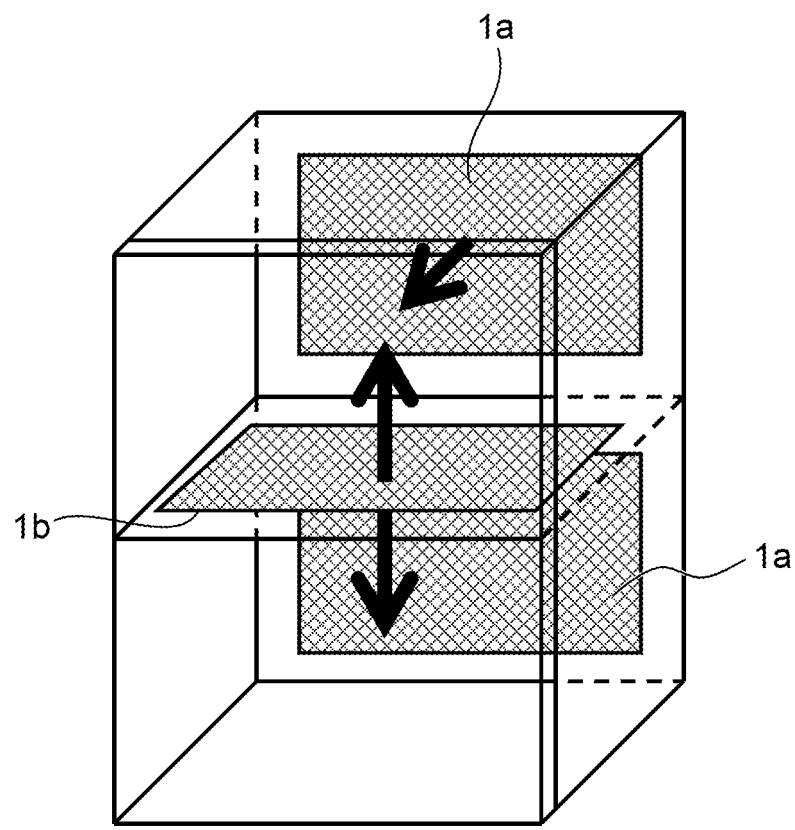
FIG. 12 is a diagram depicting a utilization example of a multilayer glass 1 pertaining to a seventh embodiment of the present invention.

FIG. 12 is a diagram depicting a utilization example of a multilayer glass 1 pertaining to a seventh embodiment of the present invention. An example is illustrated here in which multilayer glasses 1a and 1b are placed on inside walls of a refrigerator. Multilayer glasses 1a are placed on a rear wall surface and a multilayer glass 1b is placed on the surface of a separation shelf which separates the inside space of the refrigerator into upper and lower chambers. LEDs 2 with which the multilayer glass 1b is equipped emit light toward both sides of the multilayer glass and LEDs 2 with which the multilayer glasses 1a are equipped emit light toward one side of the multilayer glass (toward the inside of the refrigerator). Coating or a sheet (not depicted) having a high reflection ratio is placed on the outer side of the multilayer glasses 1a defining the outside of the refrigerator and reflects light from the inside. This configuration illuminates the inside of the refrigerator brightly and enables it to look in the upper and lower chambers across the multilayer glass 1b; visibility is improved. Especially because making the gap 5 vacuum enhances adiabaticity, it is suitable to use the multilayer glasses 1a, 1b as inner walls of the refrigerator.

Figure 13:
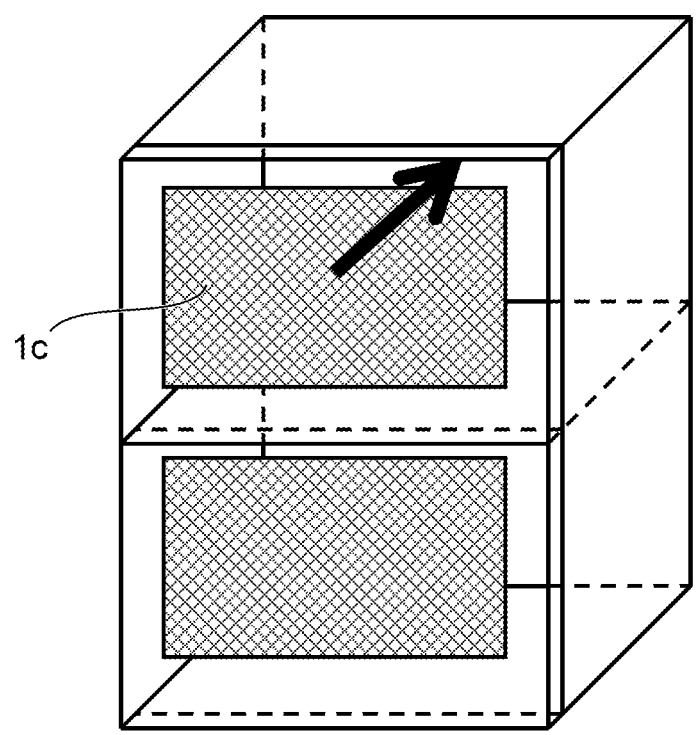
FIG. 13 depicts a configuration example in which multilayer glasses 1c are placed on the front door of a refrigerator.

FIG. 13 depicts a configuration example in which multilayer glasses 1c are placed on the front door of a refrigerator. In the case of placing the multilayer glasses 1c on the front door, the inside of the refrigerator can be viewed through the multilayer glasses 1c. The multilayer glasses 1c can be used with either or both of the multilayer glasses 1a, 1b described with FIG. 12 or can be used independently.

Figure 14:
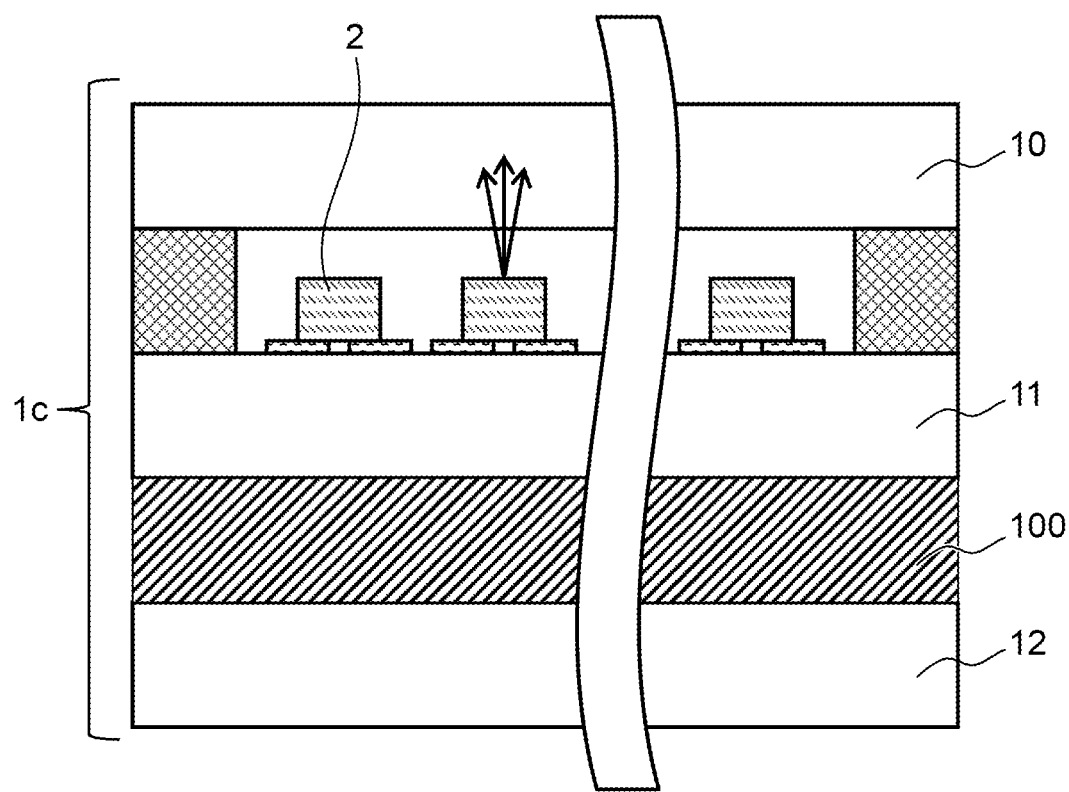
FIG. 14 is a cross-sectional view of a multilayer glass 1c, depicting its structure.

FIG. 14 is a cross-sectional view of a multilayer glass 1c, depicting its structure. The multilayer glass 1c is provided with a glass plate 12 in addition to the configuration described in the first embodiment. A light modulation film 100 is placed between glass plates 11 and 12. LEDs 2 emit light toward the inside of the refrigerator. The light modulation film 100 is a film that switches, by applying a predetermined voltage or current, between a state in which the film transmits light without scattering light and a state in which the film blocks out or scatters light. As the light modulation film 100, for example, a polymer-dispersed liquid crystal panel, electrochromic panel, SPD (Suspended Particle Device) among others can be used.

When a user looks in the inside of the refrigerator, the light modulation film 100 turns to the light transmitting state and the inside of the refrigerator is illuminated by the LEDs 2 as necessary. This enables it to view the inside of the refrigerator without opening and closing the front door, and therefore, it is possible to save energy consumption to maintain the temperature inside the refrigerator.

Figure 15:
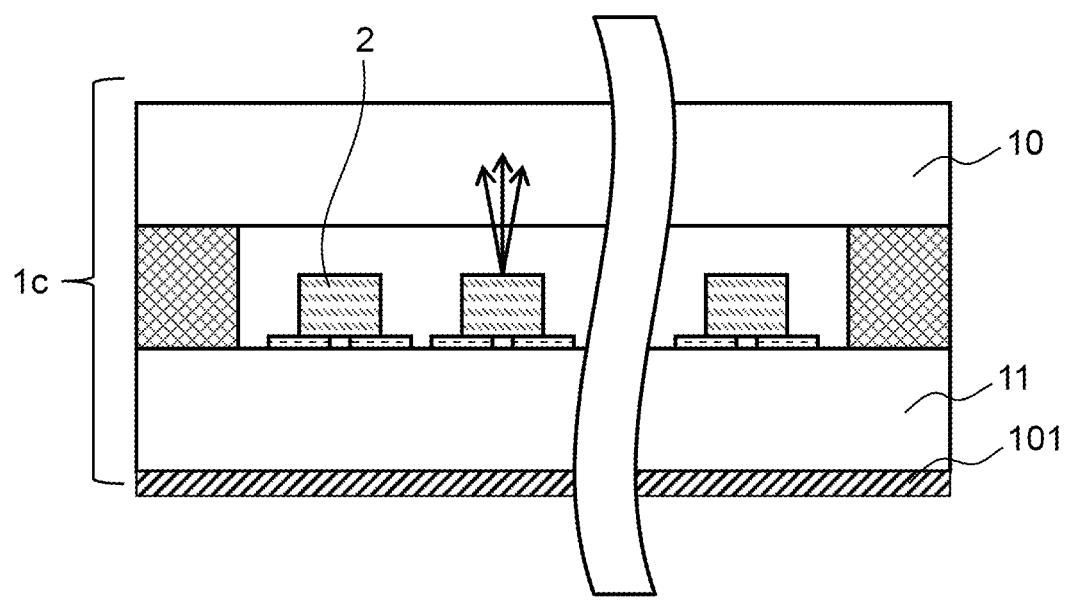
FIG. 15 is a cross-sectional view of a multilayer glass 1c, depicting another structure example.

FIG. 15 is a cross-sectional view of a multilayer glass 1c, depicting another structure example. Instead of using the light modulation film 100, a half mirror 101 may be formed for use on the surface of the outer side of the glass plate 11 defining the outside of the refrigerator. In this case, although the inside of the refrigerator is hard to view when surroundings of the refrigerator are brighter than the inside of the refrigerator, by lighting the LEDs 2 of any of the multilayer glasses 1a to 1c to illuminate the inside of the refrigerator, the inside of the refrigerator becomes brighter than the surroundings and the inside of the refrigerator can be viewed without opening the front door.

A coefficient of overall heat transmission which indicates the heat insulation performance of the multilayer glasses 1a to 1c is preferably smaller than 1 W/m²·K, and more preferably, smaller than 0.5 W/m²·K. To improve the heat insulation performance, a multilayer glass having two or more layers of gap 5 may be used.

FIG. 7 is a top view of a multilayer glass 1 pertaining to a fourth embodiment of the present invention. In this fourth embodiment, the conductors 30 are formed only on the surface of the glass plate 11, as is the case for the first embodiment. However, the conductors 30 are formed so as to be wider than those in the first embodiment and cover most of the surface of the glass plate 11.

In the foregoing embodiments, as the LEDs 2, just the LED elements can be used, in addition to packaged ones. Also in the foregoing embodiments, although examples are described in which optical elements are placed between the glass plates 10 and 11, it is also possible to add another glass plate separated by a gap. In this case, because of additional gaps, inter alia, heat insulation performance and noise barrier performance can be improved.

LIST OF REFERENCE SIGNS

1: multilayer glass,
10: glass plate,
11: glass plate,
2: optical elements (LEDs),
30: conductors,
4: low-temperature sealing material,
5: gap,
6: spacer,
7: optical element (camera),
8: object,
9: viewer,
100: light modulation film.

The invention claimed is:

1. A multilayer glass comprising:
   a first glass plate;
   a second glass plate, wherein the first glass plate and the second glass plate are placed to face each other across a gap;
   a conductor that includes a first conductor formed on a surface of the first glass plate abutting the gap and a second conductor formed and on a surface of the second glass plate abutting the gap;
   an optical element installed within the gap, wherein the optical element includes:
      at least one LED that emits light upon receiving power supplied via the conductor,
      a first end that is electrically connected to the first conductor; and
      a second end that is electrically connected to the second conductor; and
   a seal portion that seals the gap, wherein the seal portion is made from at least a vanadic glass that has a softening point between 220° C. and 280° C.

2. The multilayer glass according to claim 1, wherein the vanadic glass has been doped with an additional substance.

3. The multilayer glass according to claim 2, wherein the additional substance include at least one of BaO, WO₃, Y₂O₃, La₂O₃, Al₂O₃, and Fe₂O₃.

4. The multilayer glass according to claim 1, wherein the multilayer glass comprises a spacer which is packed in the gap and secures a separation distance between the surface of the first glass plate and the surface of the second glass plate.

5. The multilayer glass according to claim 1, wherein the conductor is configured to transmit light having a wavelength within a first wavelength region and to reflect light having a wavelength within a second wavelength region that differs from the first wavelength region.

6. The multilayer glass according to claim 1, wherein the optical element is formed on a flexible substrate packed in the gap.

7. The multilayer glass according to claim 1, wherein the vanadic glass has a curing temperature that is not more than 300° C.

8. The multilayer glass according to claim 1, wherein the multilayer glass has a heat insulation of 1 W/m²·K or less.

9. The multilayer glass according to claim 1, wherein the seal portion seals the gap to form a vacuum within the gap.

10. A multilayer glass comprising:
    a first glass plate;
    a second glass plate, wherein the first glass plate and the second glass plate are placed to face each other across a gap;
    a first conductor formed on a surface of the first glass plate abutting the gap;
    a second conductor formed on a surface of the second glass plate abutting the gap;
    a seal portion that seals the gap, wherein the seal portion is made from at least a vanadic glass that has a softening point between 220° C. and 280° C.; and a plurality of optical elements arranged at lattice points within the gap, wherein each of the plurality of optical elements includes:
  at least one LED that emits light upon receiving power supplied via the first conductor, and the second conductor
  a first end that is electrically connected to the first conductor; and
  a second end that is electrically connected to the second conductor;
wherein the first conductor electrically interconnects one or more of the plurality of optical elements arranged on a first line extending in a first direction; and
wherein the second conductor electrically interconnects one or more of the plurality of optical elements arranged on a second line extending in a second direction that differs from the first direction.

11. The multilayer glass according to claim 10, wherein the vanadic glass has been doped with an additional substance.

12. The multilayer glass according to claim 11, wherein the additional substance include at least one of BaO, $WO_3$, $Y_2O_3$, $La_2O_3$, $Al_2O_3$, and $Fe_2O_3$.

13. The multilayer glass according to claim 10, wherein the multilayer glass has a heat insulation of 1 $W/m^2 \cdot K$ or less.

14. The multilayer glass according to claim 10, wherein the seal portion seals the gap to form a vacuum within the gap.

* * * * *